United States Patent [19]

Matthews et al.

[11] Patent Number: 5,426,386

[45] Date of Patent: Jun. 20, 1995

[54] LOW-POWER SEMICONDUCTOR VOLTAGE COMPARATOR WITH HYSTERESIS

[75] Inventors: Wallace E. Matthews, Richardson; Gene L. Armstrong, II, Garland, both of Tex.

[73] Assignee: Benchmarq Microelectronics, Inc., Carrollton, Tex.

[21] Appl. No.: 871,385

[22] Filed: Apr. 21, 1992

[51] Int. Cl.$^6$ .............................................. H03K 5/24
[52] U.S. Cl. ........................................ 327/63; 327/70; 327/540; 327/205
[58] Field of Search ............ 307/350, 355, 359, 296.1, 307/296.4, 296.6; 365/229; 327/63, 70, 540, 205

[56] References Cited

U.S. PATENT DOCUMENTS

| | | | |
|---|---|---|---|
| 3,859,638 | 1/1975 | Hume, Jr. | 340/173 |
| 4,122,359 | 10/1978 | Breikss | 307/64 |
| 4,323,788 | 4/1982 | Smith | 307/66 |
| 4,381,458 | 4/1983 | Anstey et al. | 307/66 |
| 4,422,163 | 12/1983 | Oldenkamp | 365/229 |
| 4,451,742 | 5/1984 | Aswell | 307/66 |
| 4,458,307 | 7/1984 | McAnlis et al. | 364/200 |
| 4,496,168 | 1/1985 | D'Antonio et al. | 280/612 |
| 4,602,169 | 7/1986 | Shimizu | 307/355 |
| 4,617,473 | 10/1986 | Bingham | 365/229 |
| 4,645,943 | 2/1987 | Smith, Jr. et al. | 307/150 |
| 4,670,703 | 6/1987 | Williams | 320/22 |
| 4,673,826 | 6/1987 | Masson | 307/66 |
| 4,677,363 | 6/1987 | Kopmann | 320/44 |
| 4,709,202 | 11/1987 | Koenck et al. | 320/43 |
| 4,713,555 | 12/1987 | Lee | 307/66 |
| 4,716,354 | 12/1987 | Hacker | 320/39 |
| 4,730,121 | 3/1988 | Lee et al. | 307/66 |
| 4,849,682 | 7/1989 | Bauer et al. | 320/15 |
| 4,890,013 | 12/1989 | Arcus | 307/355 |
| 4,918,368 | 4/1990 | Baker et al. | 320/40 |
| 4,961,043 | 10/1990 | Koenck | 320/21 |
| 5,157,291 | 10/1992 | Shimoda | 307/355 |

Primary Examiner—Timothy P. Callahan
Assistant Examiner—My Trang Ton
Attorney, Agent, or Firm—Gregory M. Howison

[57] ABSTRACT

The low power voltage comparator with hysteresis includes a comparator (10) that is operable to receive the output from a battery (14) on the positive input thereof and the output of a battery (16) on the negative input thereof. An offset circuit (22) is provided in series with the voltage of the battery (14) and the comparator (10), and an offset circuit (24) is provided between the battery (16) and the comparator (10). The offset circuits (22) and (24) are adjustable by a hysteresis control circuit (26) to offset the voltage thereof for the non-selected battery to be higher than that for the selected battery such that the voltage drop across the offset for the non-selected battery is greater than that for the selected battery. When the voltage on the selected battery falls below the offset voltage of the non-selected battery, the hysteresis control then decreases the offset upon selecting the other battery and increases the offset or the battery that is deselected. The offset circuits (22) and (24) each comprise primary resistive elements (26) and (36) which are connected through a current sink (50) to ground. The selection process by the hysteresis control circuit (26) is operable to place a parallel resistor (32) or (44) in parallel with the resistors (26) and (36), respectively. The selection process is effected with switches (34) and (46).

24 Claims, 2 Drawing Sheets

LOW-POWER SEMICONDUCTOR VOLTAGE COMPARATOR WITH HYSTERESIS

CROSS-REFERENCE TO RELATED APPLICATIONS

The present application relates to U.S. Pat. No. 5,187,396, issued Feb. 16, 1993, and entitled "Differential Comparator Powered from Signal Input Terminals for Use in Power Switching Applications", and U.S. patent application Ser. No. 840,624, filed Feb. 21, 1992, entitled "RAM With Rechargeable Lithium Battery", which is a continuation of U.S. patent application Ser. No. 523,976, filed May 16, 1990, now abandoned.

TECHNICAL FIELD OF THE INVENTION

The present invention pertains in general to differential comparators, and more particularly, to an analog comparator that receives its power from the input terminals for utilization in a power switching application to switch between two external power supplies with hysteresis provided for the switching operation.

BACKGROUND OF THE INVENTION

In active power switching applications, a decision/controller circuit is provided to control two switches to select between one of two power supplies having a higher voltage. These decision/controller circuits typically are connected to a power terminal on the output of the two switches to receive the operating power therefrom. In operation, these decision/controller circuits receive as comparison inputs the voltages output from each of the power supplies. Two control outputs are added to control each of the two switches, depending upon the relative input level.

When the two power supplies comprise batteries, the decision/controller circuit must make a determination as to which of the power supplies is the highest, this being some indication that the battery with the highest charge is given preference over the other. However, after charge has been depleted from a battery, the voltage thereof will be reduced and then the decision/controller circuit is operable to switch to the other battery. When the charge in this battery has been depleted below that of the first battery, the decision/controller circuit will then switch back to the first battery. This will continue until the charge in both batteries have been depleted, thus providing some equalization in the charge depletion of both batteries. One system that discloses such a device is illustrated in U.S. Pat. No. 4,645,943.

One disadvantage to the prior art systems for determining the switching point of the decision/controller circuit between the two batteries is the current requirements therefore. These circuits specifically utilize some type of diode configured devices that drive a load resistor. When the voltage is near a switching threshold, the diode typically is highly conductive just prior to switching. However, when the battery is connected, this typically indicates a battery backed-up condition which can continue for a long duration of time. As such, the decision/controller circuit can be in a high battery drain condition for a long duration of time, proximate to the point where the system switches from one battery to another. As a result, these prior systems have significant disadvantages with respect to battery drain or current limiting resistor value/area during the operation thereof.

SUMMARY OF THE INVENTION

The present invention disclosed and claimed herein comprises a low power voltage comparator for comparing the voltages of two supplies. A comparison device is provided having first and second inputs for receiving first and second input voltages and an output with first and second states. The comparator operates in the first state when the first input voltage is higher than the second input voltage, and in the second state when the first input voltage is lower than the second input voltage. A first offset device is disposed between the first input voltage and the second input voltage and having first and second offset voltages selectable by a hysteresis control signal. The first offset device is operable to offset the first input voltage by either the first or second offset voltages from the first supply, the first offset voltage being less than the second offset voltage. A hysteresis control circuit is operable in response to the output state of the comparison device to select either the first or the second offset value. The first offset voltage is selected when the comparison device output is in the first state, and the second offset voltage is selected when the comparison device output is in the second state.

In another aspect of the present invention, the first offset device is comprised of a current source for sourcing current from the first supply to a current sink and having a resistive element associated therewith. The resistive element causes a voltage offset to exist between the first supply and the first input to the comparison device. A resistive controller is operable to vary the impedance of the resistive element from a first resistive value to provide the first offset voltage to a second and higher resistive value to provide the second offset voltage in response to the hysteresis control signal generated by the hysteresis control circuit.

In yet another aspect of the present invention, the resistive element is comprised of a primary resistive device having a primary value and a switchable secondary resistive device disposed in parallel therewith. The secondary resistive device is controlled by a switch to place it in parallel with the primary resistive device to lower the resistance thereof and the associated voltage offset.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
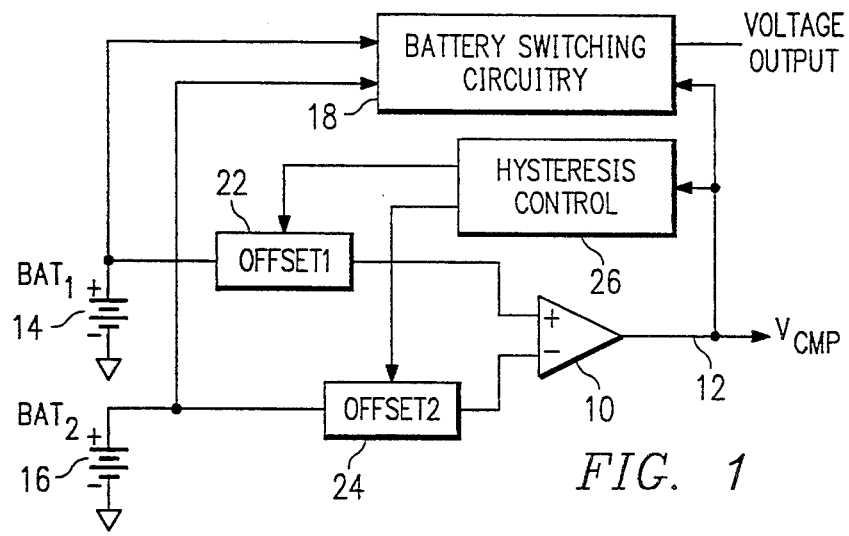
FIG. 1 illustrates a logic block diagram of the system of the present invention.

Referring now to FIG. 1, there is illustrated a block diagram of the decision/control circuit of the present invention. A comparator 10 is provided, having a positive input and a negative input. The output of the comparator is provided on a line 12 and is labelled $V_{CMP}$. A first battery 14, labelled Bat₁ is provided, along with a second battery 16, labelled Bat₂. The positive terminal of the battery 14 is connected to the input of a battery switching circuit 18 and the negative terminal of the battery 14 is connected to ground. Similarly, the positive terminal of battery 16 is connected to a second input of the battery switching circuit 18 and the negative terminal thereof is connected to ground. The battery switching circuit 18 is operable in response to the voltage $V_{CMP}$ on the line 12 to select the output of only one of the batteries 14 or 16, depending upon various threshold parameters, as will be described hereinbelow. The positive terminal of battery 14 is also connected to the positive input of the comparator 10 through a first offset circuit 22 and, similarly, the positive terminal of the battery 16 is connected to the negative input of the comparator 10 through a second offset circuit 24. The offsets 22 and 24 are controlled by a hysteresis control circuit 26, which is controlled by the signal $V_{CMP}$ on line 12.

In operation, the offsets 22 and 24 are operable to provide a voltage offset to the voltage on the positive terminals of the respective batteries 14 and 16. For example, if battery 14 were at 3.0 volts and battery 16 were at 3.1 volts, the offset of the offset circuits 22 and 24 might be set such that the voltage on the negative terminal on the comparator 10 would be set to a lower voltage such as 2.8 volts, and the first offset circuit 22 would be set such that there was virtually no voltage drop to the positive input of comparator 10, i.e., it would be set at 3.0 volts. After the battery 14 has been connected and charge drained therefrom, the voltage would drop below 2.8 volts and the comparator 10 would change from a positive to a negative voltage on the output thereof. This would cause the hysteresis control circuit 26 to set the voltage on the negative terminal of comparator 10 to the voltage on the positive terminal of battery 16 and lower the voltage on the positive terminal of comparator 10 from the voltage on positive terminal of battery 14. Thereafter, the voltage on the positive terminal of battery 16 would have to fall below the offset voltage on the positive input of the comparator 10 before the system would switch back to the positive battery 14.

Figure 2:
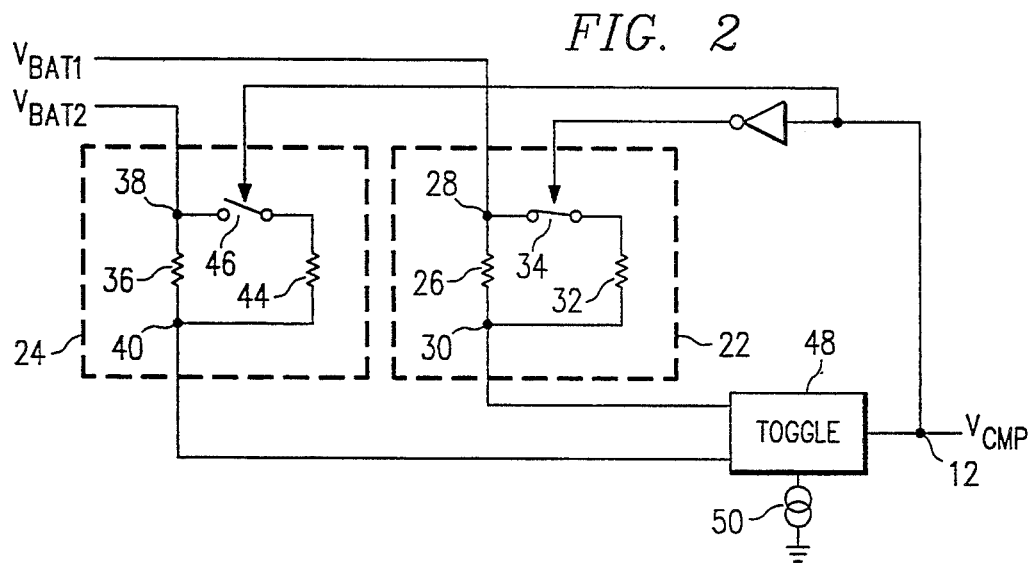
FIG. 2 illustrates a more detailed diagrammatic view of the hysteresis control circuit.

Referring now to FIG. 2, there is illustrated a more detailed diagrammatic view of the hysteresis control circuit 26. Each of the offsets 22 and 24 is comprised of resistive elements. The first offset circuit 22 is comprised of a resistive element 26 connected between a node 28 and a node 30. A parallel resistor 32 is connected between the node 30 and one side of a switch 34. The other side of the switch 34 is connected to the node 28. Similarly, the second offset circuit 24 is comprised of a resistive element 36 connected between a node 38 and a node 40. A parallel resistor 44 is connected between the node 40 and one side of a switch 46, the other side of switch 46 connected to the node 48. Hysteresis is provided by closing one of the switches 34 and 46 and opening the other. In the illustration in FIG. 2, switch 34 is illustrated as being closed and switch 46 is illustrated as being open.

Node 28 is connected to the voltage on the positive terminal of battery 14, labelled $V_{BAT1}$, and a node 38 is connected to the positive terminal of battery 16, labelled $V_{BAT2}$. The terminal 30 is connected to one input of a toggle circuit 48 and the terminal 40 is connected to the other input of the toggle circuit 48, providing the comparator operation of the comparator 10. The toggle circuit 48 is operable to sink current to a constant current source 50. Therefore, current is drawn from the positive terminal of battery 14 or the positive terminal of battery 16 through a constant current source 50 such that a voltage is developed across the resistive element 36, alone or in combination with the resistive element 44 in offset circuit 24, and a voltage is developed across resistive element 26, alone or in combination with the resistive element 32 in offset circuit 22, depending upon the state of switches 34 and 46.

The output voltage $V_{CMP}$ of the toggle circuit 48 is operable to control the switch 46 through a direct connection. Additionally, the output voltage $V_{CMP}$ is input to an invertor, the output of which drives switch 34. Therefore, switches 34 and 46 are always in opposite states, i.e., one is closed when the other is open.

Figure 3:
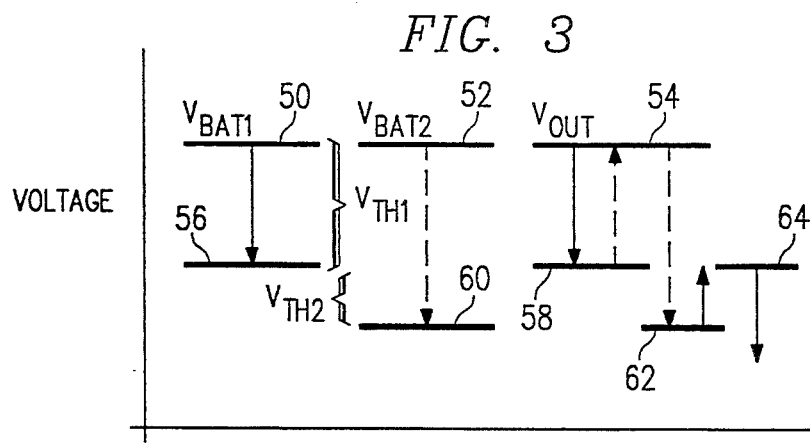
FIG. 3 illustrates a diagrammatic view of the voltage operation of the present invention.

Referring now to FIG. 3, there is illustrated a diagrammatic view of the voltages that exist during operation of the battery. As described in U.S. patent application Ser. No. 523,976, entitled "RAM with Rechargeable Lithium Battery", the battery switching circuitry 18 is only implemented when main power is removed. During this condition, the system switches over to backup battery voltage. During this time, one of the two batteries is selected. In the preferred embodiment, the system always selects one of the batteries initially by closing the associated switch 34 or 46. Therefore, the actual voltage difference in the negative direction, i.e., when the selected battery voltage falls below the voltage of the non-selected battery, would have to be greater by the offset difference.

In the illustration in FIG. 3, both batteries 14 and 16 are initially set to equal values, as indicated by a level 54 for the voltage $V_{BAT1}$ and a level 52 for the voltage $V_{BAT2}$. Initially, the voltage $V_{BAT1}$ would be selected by the battery switching circuitry 18, such that the voltage $V_{OUT}$ from the battery switching circuit 18 would be at a level equal to that of $V_{BAT1}$ as indicated by a level 54. The voltage $V_{BAT1}$ would then decrease due to current drain therefrom over time and the voltage $V_{BAT2}$ would remain constant. The voltage $V_{BAT1}$ would decrease to a level 56, which differs from the voltage on $V_{BAT2}$ by a threshold voltage $V_{TH1}$. When this voltage difference exists, the comparator 10 would change states and the battery switching circuitry 18 would select the other battery. Concurrently, the voltage on the output of the battery switching circuit 18 would change from the level 54 to a level 58 equal to a level 56, at which time it would rise back up to the level 54, which is the same as the level 52 of $V_{BAT2}$. This is indicated by a dotted line frown level 58 to level 54. At this time, the level 56 on $V_{BAT1}$ would remain constant, and the level 52 for $V_{BAT2}$ would decrease to past the level 56 for $V_{BAT1}$ to a level 60 that is below the voltage on $V_{BAT1}$ by a voltage $V_{TH2}$. Concurrently, the voltage $V_{OUT}$ would vary from the level 54 to a level 62 that is equal to the voltage at level 60. At this point, the switching circuit 18 would switch back over to the battery 14 and the voltage $V_{BAT1}$ and the voltage $V_{OUT}$ would rise up to a level 64, equal to the level 56. Both $V_{BAT1}$ at level 56 would decrease and the voltage $V_{OUT}$ would decrease.

When the battery switching circuitry 18 selects the voltage $V_{BAT1}$, this will be selected until the voltage $V_{BAT1}$ is less than the voltage $V_{BAT2}$ by a voltage difference of $V_{TH1}$. Similarly, when the voltage $V_{BAT2}$ is selected, it will remain selected until the voltage thereof falls below the voltage $V_{BAT1}$ by a voltage of $V_{TH2}$. The voltage $V_{TH1}$ and $V_{TH2}$ are selected by the value of the resistive elements 26 and 32 in the offset circuit 24 and the resistive elements 36 and 44 in the offset circuit 24. As will be described hereinbelow, the current through the resistors, is held relatively constant and does not vary as a function of the voltage inputs to the toggle circuit 48 being proximate to any of the switching thresholds. Further, both the hysteresis control circuit 26 and the comparator 10 are driven from the battery voltages themselves. Although not illustrated, the power to the comparator 10 from the hysteresis control circuit 26 is driven from the higher of the two batteries 14 and 16 independent of the actual switching of the toggle circuit 48.

Figure 4:
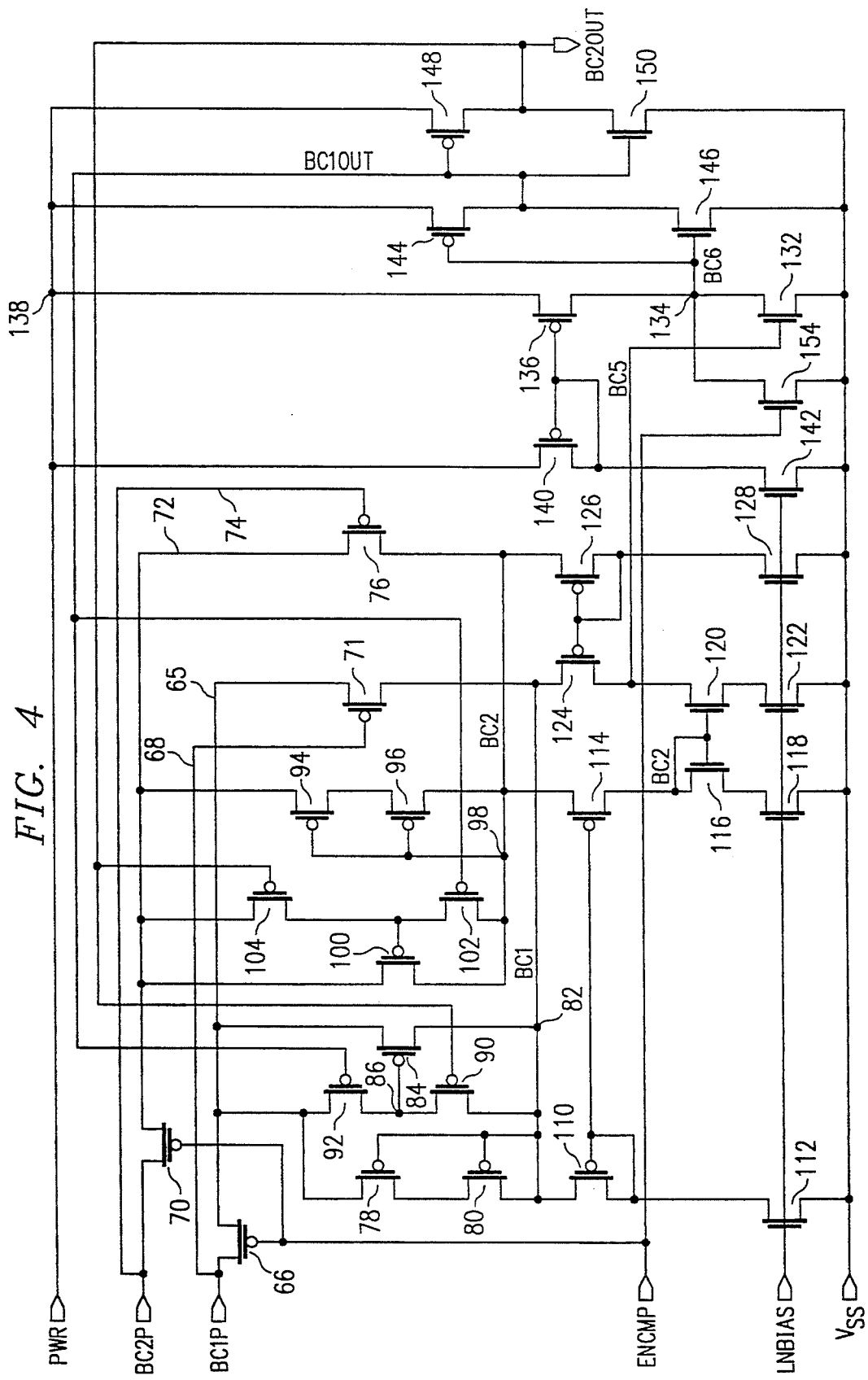
FIG. 4 illustrates a detailed schematic diagram of the circuit of the present invention.

Referring now to FIG. 4, there is illustrated a schematic diagram of the comparator 10, hysteresis control 26 and offsets 22 and 24. The primary battery voltage of battery 14 is input on a terminal labelled BC1P and the voltage on battery 16 is input on a terminal labelled BC2P. The primary battery voltage is input to one side of the source/drain path of a P-channel transistor 66, the other side of the source/drain path connected to a node 65. The terminal BC1P is also connected to a node 68. Node 68 is connected to the gate of a P-channel transistor 71, the source/drain thereof connected on one side to the node 65. The gate of the transistor 66 is connected through a control terminal ENCNP, this terminal ENCNP is operable to select the battery back-up function of the overall circuit. As described above, primary power is provided from an external power source which is disconnected in a low power condition. A comparator is provided (not shown) that is operable to compare the external supply with a reference voltage and, when it falls below this reference voltage, the signal ENCNP is pulled to ground, thus turning on transistor 66. A second P-channel transistor 70 is provided with the source/drain path thereof connected between the terminal BC2P and a node 72. The gate of transistor 70 is connected to the ENCNP terminal. The BC2P terminal is also connected to a node 74, node 74 connected to the gate of a P-channel transistor 76, one side of the source/drain path thereof connected to node 72.

Node 65 is connected to one side of the source/drain path of a P-channel transistor 78 which is connected in series with the source/drain path of a P-channel transistor 80. The other side of the source/drain path of transistor 80 is connected to a node 82 and the gates of transistors 78 and 80 are also connected to the node 82, node 82 providing an output signal BC1. In addition, node 65 is also connected through the source/drain path of the P-channel transistor 71 to the node 82 and also through the source/drain path of the P-channel transistor 84 to the node 82, the gate of transistor 84 connected to a node 86. Node 86 is connected through the source/drain path of a P-channel transistor 90 to the node 82 and node 86 is also connected through the source/drain path of a P-channel transistor 92 to the node 65. The gate of transistor 90 is connected to the signal BC2OUT, and the gate of transistor 92 is connected to the signal BC1OUT. The signal BC2OUT is similar to the voltage $V_{CMP}$ in FIG. 2 with the voltage signal BC1OUT being the inverse thereof. Therefore, when BC2OUT is low, transistor 90 is turned on pulling the gate of transistor 84 low and turning transistor 84 on. This allows transistor 84 to conduct. Similarly, transistors 78 and 80 are in a diode configuration and always in a conductive mode, with the node 82 having a current source attached thereto, as will be described hereinbelow. Transistors 78 and 80 comprise the resistor 26 in the offset circuit 22 and transistor 84 comprises the resistor 32 in the offset 22. The switch 34 is comprised of the transistors 90 and 92.

The node 72 is connected through two series connected P-channel transistors 94 and 96 to a node 98. The node 98 is labelled BC2. The gates of transistors 94 and 96 are connected together and to the node 98 to provide a diode configuration. The node 72 is also connected through the source/drain path of a transistor 100 to the node 98. The gate of transistor 100 is connected through the source/drain path of a P-channel transistor 102 to the node 98 and also through the source/drain path of a transistor 104 to the node 72. The gate of transistor 102 is connected to the BC1OUT signal and the gate of transistor 104 is connected to the BC2OUT signal. Therefore, when BC2OUT is low, transistor 104 is turned on and the gate of transistor 100 is pulled high, thus turning it off. When BC2OUT is high and BC1OUT is low, transistor 104 is turned off, and transistor 102 is turned on, pulling the gate of transistor 100 low. This turns transistor 100 on. Transistors 94 and 96 comprise the resistor 36 in the offset circuit 24 and transistor 100 comprises the resistor 44 in offset circuit 24. Switch 46 is comprised of the transistors 102 and 104.

The primary transistors 78 and 80 in offset circuit 22, and 94 and 96 in offset circuit 24 have a ratio of 3.1:40 with the transistors 84 and 100 having a width-to-length ratio of 33:1.2. Therefore, transistors 84 and 100 are much wider transistors, producing a much lower impedance. Node 82 is connected to one side of the source/drain path of the P-channel transistor 110, the other side thereof connected through the source/drain path of an N-channel transistor 112 to $V_{SS}$. The gate of N-channel transistor 112 is connected to a bias signal LNBIAS to provide a constant current bias with the gate of transistor 110 connected to the drain thereof in a diode configuration. Therefore, current from node 82 is sinked through transistors 110 and 112 to $V_{SS}$.

The node 98 is similarly connected through the source/drain path of a P-channel transistor 114 to one side of the source/drain path of an N-channel transistor 116. The other side of the source/drain path of transistor 116 is connected through the source/drain path of an N-channel transistor 118 to $V_{SS}$. The gate of transistor 118 is connected to the gate of transistor 112 and the gate of transistor 116 is connected to the drain thereof. The gate of transistor 114 is connected to the gate of transistor 110. The gate of transistor 116 is connected to the gate of an N-channel transistor 120, the source/drain path of transistor 120 connected on one side thereof through the source/drain path of an N-channel transistor 122 to $V_{SS}$. The gate of transistor 122 is connected to the current bias signal LNBIAS. The drain of transistor 120 is connected to one side of the source/drain path of the P-channel transistor 124, the other side thereof connected to the node 82. Similarly, a P-channel transistor 126 has the source thereof connected to the node 98 and the drain thereof connected both to the gate of transistor 126 and the gate of transistor 124 and also through the source/drain path of an N-channel transistor 128 to $V_{SS}$. The gate of transistor 128 is connected to the LNBIAS signal. The transistors 124 and 126 provide a differential pair similar to transistors 110 and 114.

The drain of transistor 124 comprises the output BC5, which is connected to the gate of an N-channel transistor 132. N-channel transistor 132 has the source thereof connected to $V_{SS}$ and the drain thereof connected to a node 134, which is labelled BC6. A P-channel transistor 136 has the drain thereof connected to the node 134 and the source thereof connected to a node 138 that comprises the power terminal PWR. As described above, the power terminal derives its power from the batteries 14 and 16, but always selects the highest battery. This is provided by a circuit (not shown) that is operable to select the highest power battery. Additionally, a P-channel transistor 140 has the source/drain thereof connected with the power terminal node 138 and the drain thereof connected through source/drain path of an N-channel transistor 142 to $V_{SS}$. The gate of transistor 142 is connected to the LNBIAS signal. The gate of transistor 140 is connected to both the gate of the transistor 136 and also to the drain thereof in a diode configuration. The node 134 is connected to the gate of a P-channel transistor 144 and also to the gate of an N-channel transistor 146. The source/drain path of transistor 146 is connected on the source side thereof to $V_{SS}$ and on the drain side thereof to the drain of the P-channel transistor 144. The source of transistor 144 is connected to the power terminal node 138 and also to the drain of transistor 144 comprising the BC1OUT signal. Transistors 144 and 146 comprise an invertor. A second invertor is provided with a P-channel transistor 148 and an N-channel transistor 150 having the source/drain paths thereof connected in series, with the source of transistor 150 connected to $V_{SS}$ and the drain thereof connected to the drain of the P-channel transistor 148. The source of transistor 148 is connected to the power terminal node 138, the drain of transistor 148 providing a BC2OUT signal. The ENCMP is connected to the gate of an N-channel transistor 154, the drain thereof connected to ground and the source thereof connected to the node 134. Therefore, when the ENCMP signal is high, indicating that batteries are not selected, the primary power is selected, transistor 154 is turned on, pulling node 134 to ground, which turns on transistor 144 and pulls the gate of transistor 150 high, turning transistor 150 on and pulling BC2OUT low and BC1OUT high.

In operation, when ENCMP is high, indicating the batteries are not selected, the signal BC2OUT is low and BC1OUT is high, thus turning on transistor 90 and transistor 84 and allowing current to flow through transistor 84, it being noted that current is constantly flowing through transistors 78 and 80, except when ENCMP is equal to "1." This will result in node 82 initially being pulled higher than node 98. This effectively results in selection of the battery 14 and the voltage on input terminal BC1P. Additionally, transistor 100 is off, thus placing an offset into the voltage on node 98 as compared to node 82. This pulls the voltage BC5 on the gate of transistor 132 high, turning transistor 132 on and turning transistor 144 on. When transistor 144 is on, BC1OUT is high, turning on transistor 150 and pulling voltage BC2OUT low, this maintaining the circuit in its initial configuration.

When the voltage on node 82 falls below the voltage on node 98, the transistor 114 begins to turn on and draw current therethrough. This results in BC5 going low and turning off transistor 132 with transistor 136 then pulling the voltage on node 134 high, as transistor 136 is mirrored from transistor 140, transistor 140 providing a current source. This results in transistor 146 turning on and lowering the voltage on BC1OUT and raising the voltage on BC2OUT. When BC2OUT goes high, it turns off transistor 90, 92 and 102 and turns off transistor 104. Concurrently, BC1OUT going low turns on transistor 102 which pulls the gate of transistor 100 down and allows transistor 100 to conduct. This results in the voltage on BC2 going even higher, while the voltage on BC1 falls, providing the hysteresis effect.

In summary, there has been provided a comparator for a low voltage application that selects between two power supplies. The comparator is powered from the higher of the two voltages with hysteresis provided in the switching operation. The switching operation first selects a preferred one of the two power supplies and adjusts a threshold such that the selected power supply must fall below the unselected power supply by a predetermined threshold voltage before switching to the second power supply. Upon switching to the second power supply, the hysteresis is implemented such that the second power supply must fall below the first power supply by a predetermined threshold voltage for the switching circuit to again select the first power supply. Each of the power supplies is connected to one input of the comparator through a resistor which has current drawn therethrough to a current sink. The resistive value of the resistor is altered with a switching circuit and a parallel resistor to adjust the impedance thereof.

Although the preferred embodiment has been described in detail, it should be understood that various changes, substitution's and alterations can be made therein without departing from the spirit and scope of the invention as defined by the appended claims.

What is claimed is:

1. A low power voltage comparator for comparing a voltage output of first and second supplies, comprising:

a comparison device having first and second inputs for receiving first and second input voltages, respectively, said comparison device being powered from at least one of the first and second supplies, said first and second input voltages corresponding to the voltages on the first and second supplies, respectively, and an output with first and second states, said output operating in the first state when said first input voltage is higher than said second input voltage, and said output operating in the second state when said first input voltage is lower than said second input voltage;

a first offset device disposed between said first input voltage and said first input and having first and second offset voltages selectable by a hysteresis control signal to offset said first input voltage, said first offset voltage greater than said second offset voltage, said first offset device having;

a current source for sourcing current from first input voltage and having a resistive element associated therewith to cause a voltage offset from said first input voltage for input to said first input of said comparison device, and a resistive controller for varying said resistive element from a first resistive value to provide said first offset voltage to a second and lower resistive value to provide said second offset voltage in response to a hysteresis control signal; and a hysteresis control circuit for generating a hysteresis control signal in response to the output state of said comparison device to select said first offset voltage when the output of said comparison device is in the first state, and to select said second offset voltage when the output of said comparison device is in the second state.

2. The comparator of claim 1, wherein said resistive element comprises an MOS device having the impedance therein controlled by said resistive controller.

3. The comparator of claim 1, wherein said resistive element comprises:
- a primary resistive device having a primary resistive value disposed within the current path of said current source to provide said first offset voltage;
- a secondary resistive device having a secondary resistive value; and
- a switching device for connecting said secondary resistive device in parallel with said primary resistive device in response to said hysteresis control signal selecting said second offset voltage.

4. The comparator of claim 3, wherein said primary resistive device comprises a first MOS device having a current path therethrough that is disposed in series with the current path of said current source, and said secondary resistive device comprises a second and switched MOS device that can be switched into a parallel configuration with said first MOS device by said switching device.

5. The comparator of claim 1, and further comprising a second offset device disposed between said second input voltage and said second input on said comparison device and having first and second offset voltages selectable by said hysteresis control signal to offset said second input voltage, said first offset voltage greater than said second offset voltage, said hysteresis control circuit operable in response to the output state of said comparison device to select said first offset voltage in said second offset device when said comparison device output is in said second stage, and to select said second offset voltage in said second offset device when said comparison device output is in said first state.

6. A low power voltage comparator for comparing a voltage output of two supplies on first and second supply nodes having first and second voltage levels, respectively, associated therewith, comprising:
- a comparison device having first and second inputs connected to the first and second supply nodes and an output with first and second states, said comparison device being powered from at least one of the first an second supply nodes, said output operating in the first state when the first input voltage level is higher than second input voltage level, and said output operating in the second state when first input voltage level is lower than the second input voltage level;
- a first offset device disposed between the first supply node and said first input and having first and second offset voltages selectable by a hysteresis control signal to offset the first input voltage level, said first offset voltage greater than said second offset voltage;
- a second offset device disposed between the second supply node and said second input and having first and second offset voltages selectable by said hysteresis control signal to offset the second input voltage level, said first offset voltage greater than said second offset voltage; and
- a hysteresis control circuit operable in response to the output state of said comparison device to generate said hysteresis control signal and select said first offset voltage in said first offset device and said second offset voltage in said second offset device when the output of said comparison device is in said first state, and to select said second offset voltage in said first offset device and said first offset voltage in said second offset device when the output of said comparison device is in said second state, each of said first and second offset devices having:
  - a current source for sourcing current from one of the respective first and second input voltages having a resistive element associated therewith to cause a voltage offset from the respective one of said first and second input voltages for input to the respective one of said first and second inputs of said comparison device, and
  - a resistive controller for varying said resistive element from a first resistive value to provide said first offset voltage to a second and higher resistive value to provide said second offset voltage in response to said hysteresis control signal generated by said hysteresis control circuit.

7. The comparator of claim 6, wherein said resistive element in each of said first and second offset devices comprises:
- a primary resistive device having a primary impedance value disposed within the current path of said respective current source to provide said first offset voltage;
- a secondary resistive device having a secondary resistive value;
- a switching device associated with each of said first and second offset devices for connecting said associated secondary resistive device in parallel with said associated primary resistive device in response to said hysteresis control signal selecting said second offset voltage for said associated first or second offset device.

8. The voltage comparator of claim 7, wherein said primary resistive device in each of said first and second offset devices comprises a first MOS device having a conductive path therethrough that is disposed in series with the respective one of said current sources and said secondary resistive device is comprised of a second and switched MOS device that can be switched into a parallel configuration with said associated first MOS device by said associated switching device.

9. The comparator of claim 6, wherein said hysteresis control signal is operable to select said second offset voltage in said first offset device and said first offset voltage in said second offset device upon a power up condition.

10. A method for comparing a voltage output of first and second supplies and providing a control output with hysteresis having a first output state when voltage the output of the first supply is greater than the voltage output of the second supply and a second output state when the voltage output of the first supply is less than the voltage output of the second supply, comprising the steps of:
- providing a first voltage offset device having first and second selectable offset voltages with the step of disposing a current source between the first supply and a current sink for sourcing current from the first supply to the current sink, the current source having a resistive element associated therewith to cause a voltage offset from the voltage of the first supply to provide the first offset voltage signal;

disposing the first voltage offset device in series with the voltage of the first supply to provide a first offset voltage signal;

providing a comparator having first and second inputs, the first input for receiving the first offset voltage signal and the second input for receiving the voltage of the second supply;

powering the comparator from one of the first and second supplies;

comparing the voltage of the first offset voltage signal with the voltage of the second supply with the comparator and generating the control output in the first state when the first offset voltage is determined by the comparator to be less than the second supply voltage, and generating the control output in the second output state when the first offset voltage signal is determined by the comparator to be greater than the second supply of voltage; and selecting the first offset voltage in the first offset voltage device in response to the control output being in the first output state, and selecting the second offset voltage in the first voltage offset device when the control output is in the second output state, the step of selecting operating by varying the impedance of the resistive element from a first resistive value to provide the first offset voltage to a second and lower resistive value to provide the second offset voltage.

11. The method of claim 10, wherein the step of providing the current source having the resistive element comprises:

connecting the current source between a first node and a current sink;

connecting a primary resistive device having an impedance equal to the first resistive value between the voltage output of the first supply and the node, the node providing the first offset value;

the step of connecting the primary resistive device providing the first resistive value and the first offset voltage in the first voltage offset device; and disposing a secondary resistive device having a secondary resistive impedance value in parallel with the primary resistive device in response to selection of the second offset voltage, the primary and secondary resistive devices comprising the resistive element associated with the current source.

12. The method of claim 11, wherein the step of disposing a primary resistive device between the voltage output of the first supply and the node comprises disposing a first MOS device between the output of the first supply and the node, the first MOS device in a conducting mode of operation, and the step of disposing the secondary resistive device in parallel with the first resistive device, comprises connecting the conductive path of a second and switched MOS device in parallel with the first MOS device and having one side of the conducting path thereof connected to one side of the conducting path of the first MOS device and the other side switchably connected to the other side of the conducting path of the first MOS device and switching the other side of the second MOS device to be connected with the other side of the conducting path of the first MOS device in response to selection of the second offset voltage in the step of selecting.

13. A method for comparing a voltage output of first and second supplies and providing a control output with hysteresis having a first output state when the voltage output of the first supply and the voltage output of the second supply and a second state when the voltage output of the first supply is less than the voltage output of the second supply, comprising the steps of:

sourcing current from the first supply to a current sink with a first current source;

sourcing current from the second supply to a current sink with a second current source;

disposing a first resistive element in the current path of the first current source, the first resistive element having a first selectable resistive value and a second and lower selectable resistive value to provide a first offset voltage on the opposite side of the resistive element from the first supply;

disposing a second resistive element in the current path of the second current source and having a first selectable resistive value and a second and lower selectable resistive value to provide second offset voltage on the opposite end of the second resistive element from the second supply;

providing a comparator having first and second outputs with the first output connected to the first offset voltage and the second input connected to the second offset voltage, the comparator operable to provide the control output voltage in the first state when the first input is higher than the second input and the control output in the second state when the voltage on the first input is lower the voltage on the second input;

powering the comparator from one of the first and second supplies;

comparing the first and second offset voltages with the comparator and generating the control output in the first state when the first offset voltage is determined by the comparator to be higher than the second offset voltage and generating the control output in the second state when the first offset voltage is determined by the comparator to be lower than the second offset voltage; and selecting the second resistive value in the first resistive element and the first resistive value in the second resistive element when the first offset voltage changes from a value lower than the second offset voltage to a value higher than the second offset voltage, and selecting the first resistive value in the first resistive element and the second resistive value in the second resistive element when the first offset voltage changes from a value greater than the second offset voltage to a value lower than the second offset voltage;

wherein the step of disposing the first resistive element in the current path of the current source and disposing the second resistive element in the current path of the second current source each comprise the steps of:

disposing a primary resistive device in the paths of the respective one of the first and second current sources having a primary impedance value to provide the first resistive value of the associated first and second resistive elements, disposing a switchable resistive device in parallel with the associated primary resistive device and having a secondary impedance value, and the step of selecting operable to place the switchable resistive device in a parallel conductive path with the primary resistive device when the second resistive value is selected for each of the respective first and second resistive elements.

14. The method of claim 13, wherein the step of disposing the primary resistive device in the path of the respective first and second current sources for the respective first and second resistive element comprises disposing a first MOS device in the current path of the respective first and second current sources, and the step of disposing the switchable resistive device in the parallel with the respective primary resistive device in the respective first and second resistive elements comprises connecting one end of the conductive path of a second and switched MOS device to one end of the conductive path of the first MOS device and switchably connecting the other end of the conductive path of the second and switched MOS device to the other end of the conductive path of the first MOS device to provide one mode wherein the first MOS device and the second and switched MOS device are connected in parallel, and a second mode wherein the second and switched MOS device is not connected in parallel with the first MOS device.

15. A method for comparing a voltage output of first and second supplies and providing a control output with hysteresis having a first output state when the voltage output of the first supply and the voltage output of the second supply and a second state when the voltage output of the first supply is less than the voltage output of the second supply, comprising the steps of:

sourcing current from the first supply to a current sink with a first current source;

sourcing current from the second supply to a current sink with a second current source;

disposing a first resistive element in the current path of the first current source, the first resistive element having a first selectable resistive value and a second and lower selectable value to provide a first offset voltage on the opposite side of the resistive element from the first supply;

disposing a second resistive element in the current path of the second current source and having a first selectable resistive value and a second and lower selectable resistive value to provide second offset voltage on the opposite end of the second resistive element from the second supply;

the step of disposing the first resistive element in the current path of the current source and disposing the second resistive element in the current path of the second current source each comprise the steps of:

disposing a primary resistive device in the paths of the respective one of the first and second current sources having a primary impedance value to provide the first resistive value of the associated first and second resistive elements, disposing a switchable resistive device in parallel with the associated primary resistive primary device and having a secondary impedance value, and the step of selecting operable to place the switchable resistive device in a parallel conductive path with the primary resistive device when the second resistive value is selected for each of the respective first and second resistive elements;

comparing the first and second offset voltages and generating the control output in the first state when the first offset voltage is higher than the second offset voltage and generating the control output in the second state when the first offset voltage is lower than the second offset voltage; and selecting the second resistive value in the first resistive element and the first resistive value in the second resistive element when the first offset voltage changes from a value lower than the second offset voltage to a value higher than the second offset voltage, and selecting the first resistive value in the first resistive element and the second resistive value in the second resistive element when the first offset voltage changes from a value greater than the second offset voltage to a value lower than the second offset voltage.

16. The method of claim 15, wherein the step of comparing comprises:

providing a comparator having first and second outputs with the first output connected to the first offset voltage and the second input connected to the second offset voltage, the comparator operable to provide the control output voltage in the first state when the first input is higher than the second input and the control output in the second state when the voltage on the first input is lower the voltage on the second input; and powering the comparator from one of the first and second supplies.

17. The method of claim 15, wherein the step of disposing the primary resistive device in the path of the respective first and second current sources for the respective first and second resistive element comprises disposing a first MOS device in the current path of the respective first and second current sources, and the step of disposing the switchable resistive device in the parallel with the respective primary resistive device in the respective first and second resistive elements comprises connecting one end of the conductive path of a second and switched MOS device to one end of the conductive path of the first MOS device and switchably connecting the other end of the conductive path of the second and switched MOS device to the other end of the conductive path of the first MOS device to provide one mode wherein the first MOS device and the second and switched MOS device are connected in parallel, and a second mode wherein the second and switched MOS device is not connected in parallel with the first MOS device.

18. A low power voltage comparator for comparing voltage output of first and second supplies, comprising:

a comparison device having first and second inputs for receiving first and second input voltages, respectively, said first and second input voltages corresponding to the voltage outputs on the first and second supplies, respectively, and an output with first and second states, said output operating in the first state when said first input voltage is higher than said second input voltage, and said output operating in the second state when said first input voltage is lower than said second input voltage;

a first offset device disposed between said first input voltage and said first input and having first and second offset voltages selectable by a hysteresis control signal to offset said first input voltage, said first offset voltage greater than said second offset voltage, said offset device having:

a current source for sourcing current from first input voltage and having a resistive element associated therewith to cause a voltage offset from said first input voltage for input to said first input of said comparison device, and a resistive controller for varying said resistive element from a first resistive value to provide said first offset voltage to a second and lower resistive value to provide said second offset voltage in response to generation of said hysteresis control signal; and a hysteresis control circuit for generating said hysteresis control signal in response to the output state of said comparison device to select said first offset voltage when the output of said comparison device is in the first state, and to select said second offset voltage when the output of said comparison device is in the second state.

19. The comparator of claim 18, wherein said comparison device is powered from at least one of the first and second supplies.

20. The comparator of claim 18, wherein said resistive element comprises an MOS device having the impedance therein controlled by said resistive controller.

21. The comparator of claim 18, wherein said resistive element comprises:
a primary resistive device having a primary resistive value disposed within the current path of said current source to provide said first offset voltage;
a secondary resistive device having a secondary resistive value; and
a switching device for connecting said secondary resistive device in parallel with said primary resistive device in response to said hysteresis control signal selecting said second offset voltage.

22. The comparator of claim 21, wherein said primary resistive device comprises a first MOS device having a current path therethrough that is disposed in series with the current path of said current source, and said secondary resistive device comprises a second and switched MOS device that can be switched into a parallel configuration with said first MOS device by said switching device.

23. A method for comparing a voltage output of first and second supplies and providing a control output with hysteresis having a first output state when the voltage output of the first supply is greater than the voltage output of the second supply and a second output state when the voltage output of the first supply is less than the voltage output of the second supply, comprising the steps of:
providing a first voltage offset device having first and second selectable offset voltages, the step of providing the first voltage offset device comprising:
providing a current source between the first supply and a current sink for sourcing current from the first supply to the current sink, the current source having a resistive element associated therewith to cause a voltage offset from the voltage of the first supply to provide the first offset voltage signal, and
varying the impedance of the resistive element from a first resistive value to provide the first offset voltage to a second and lower resistive value to provide the second offset voltage, the step of varying the impedance of the resistive element controlled in the step of selecting;
disposing the first voltage offset device in series with the voltage of the first supply to provide a first offset voltage signal;
comparing the voltage of the first offset voltage signal with the voltage of the second supply and generating the control output in the first state when the first offset voltage is less than the second supply voltage, and generating the control output in the second output state when the first offset voltage signal is greater than the second supply of voltage; and
selecting the first offset voltage in the first offset voltage device in response to the control output being in the first output state, and selecting the second offset voltage in the first voltage offset device when the control output is in the second output state.

24. The method of claim 23, wherein the step of comparing the first offset voltage signal with the voltage of the second supply comprises:
providing a comparator having first and second inputs, the first input for receiving the first offset voltage signal and the second input for receiving the voltage of the second supply; and
powering the comparator from one of the first and second supplies.

* * * * *